US012627287B2

(12) United States Patent
Ipek

(10) Patent No.: US 12,627,287 B2
(45) Date of Patent: May 12, 2026

(54) POWER INPUT MULTIPLEXER

(71) Applicant: RENESAS ELECTRONICS AMERICA INC., Milpitas, CA (US)

(72) Inventor: Sercan Ipek, Seefeldstrasse (CH)

(73) Assignee: RENESAS ELECTRONICS AMERICA INC., Milpitas, CA (US)

( * ) Notice: Subject to any disclaimer, the term of this patent is extended or adjusted under 35 U.S.C. 154(b) by 188 days.

(21) Appl. No.: 18/544,794

(22) Filed: Dec. 19, 2023

(65) Prior Publication Data

US 2025/0202469 A1     Jun. 19, 2025

(51) Int. Cl.
*H03K 17/00*     (2006.01)
*H02J 50/00*     (2016.01)
*H02M 3/07*     (2006.01)

(52) U.S. Cl.
CPC ............ *H03K 17/002* (2013.01); *H02J 50/00* (2016.02); *H02M 3/07* (2013.01)

(58) Field of Classification Search
CPC ........ H03K 17/002; H02J 50/00; H02M 3/07; H03M 5/02; H03M 5/00; H03M 7/00; H03M 7/001
See application file for complete search history.

(56) References Cited

U.S. PATENT DOCUMENTS

2008/0238532 A1* 10/2008 Hanazawa ....... H03K 3/356113
327/537
2024/0340003 A1* 10/2024 Haiplik ................ H03K 17/687

* cited by examiner

*Primary Examiner* — Lincoln D Donovan
*Assistant Examiner* — Amit R Bhatia
(74) *Attorney, Agent, or Firm* — SCULLY, SCOTT, MURPHY & PRESSER, P.C.

(57) ABSTRACT

Systems and devices for power multiplexing are described. A device can include a first power input circuit including a first power driver having a first gate that is configured to receive power from a first power input channel and output power to a power output channel. The device includes a second power input circuit including a second power driver having a second gate that is configured to receive power from a second power input channel and output power to the power output channel. The device includes a charge pump connected to the power output channel that generates an output having a voltage greater than a voltage on the power output channel. The device includes a switching circuit connected to the output of the charge pump that is configured to selectively control the first and second power input circuits to output power to the power output channel.

18 Claims, 6 Drawing Sheets

POWER INPUT MULTIPLEXER

BACKGROUND

The present disclosure relates in general to apparatuses and methods for power input multiplexing.

Powered systems typically have a dedicated power input channel that supplies power from an external component such as, e.g., a wall outlet, for use by the integrated circuitry within the powered system. As powered systems become more sophisticated, many system solutions have expanded to multiple power inputs channels that source power from a variety of different sources. Power multiplexers (MUXs) are utilized to switch between power inputs channels, e.g., based on the availability of each power source, the reliability of each power source, the capability of each power source or for any other reason. Such power multiplexers often include a charge pump and level shifters in the high voltage domain for each power input channel, each of which may occupy a significant area of circuit board real-estate.

SUMMARY

In an embodiment, a power multiplexer device is disclosed. The power multiplexer device comprises a first power input circuit. The first power input circuit comprises a first power driver comprising a first gate. The first power input circuit is configured to receive power from a first power input channel and to output power to a power output channel via the first power driver. The power multiplexer device further comprises a second power input circuit. The second power input circuit comprises a second power driver comprising a second gate. The second power input circuit is configured to receive power from a second power input channel and to output power to the power output channel via the second power driver. The power multiplexer device further comprises a charge pump connected to the power output channel. The charge pump is configured to generate an output having a voltage greater than a voltage on the power output channel. The power multiplexer device further comprises a switching circuit connected to the output of the charge pump. The switching circuit is configured to selectively control the first and second gates to drive the first and second power input circuits to output power to the power output channel.

In an embodiment, a semiconductor device is disclosed. The semiconductor device comprises a first power input circuit. The first power input circuit comprises a first power driver comprising a first gate. The first power input circuit is configured to receive power from a first power input channel and to output power to a power output channel via the first power driver. The semiconductor device further comprises a second power input circuit. The second power input circuit comprising a second power driver comprising a second gate. The second power input circuit is configured to receive power from a second power input channel and to output power to the power output channel via the second power driver. The semiconductor device further comprises a switching circuit comprising a current generator, a first transistor switch corresponding to the first power input circuit and a second transistor switch corresponding to the second power input circuit. Each of the first and second transistor switches is configured as a current mirror driven by a reference current output of the current generator. The switching circuit is configured to selectively supply a first current output of the first transistor switch to the first gate of the first power driver to selectively control the first gate and selectively supply a second current output of the second transistor switch to the second gate of the second power driver to selectively control the second gate.

In an embodiment, a semiconductor device is disclosed. The semiconductor device comprises a wireless power transfer circuit that is configured to output a first power input channel and a power multiplexer circuit. The power multiplexing circuit comprises a first power input circuit. The first power input circuit comprises a first power driver comprising a first gate. The first power input circuit is configured to receive power from the first power input channel and to output power to a power output channel via the first power driver. The power multiplexing circuit further comprises a second power input circuit. The second power input circuit comprises a second power driver comprising a second gate. The second power input circuit is configured to receive power from a second power input channel and to output power to the power output channel via the second power driver. The power multiplexing circuit further comprises a charge pump connected to the power output channel. The charge pump is configured to generate an output having a voltage greater than a voltage on the power output channel. The power multiplexing circuit further comprises a switching circuit connected to the output of the charge pump. The switching circuit is configured to selectively control the first and second gates to drive the first and second power input circuits to output power to the power output channel. The semiconductor device further comprises a battery charger circuit that is configured to receive the power output channel. The battery charger circuit is configured to charge a battery based on the power output channel.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Figure 1:
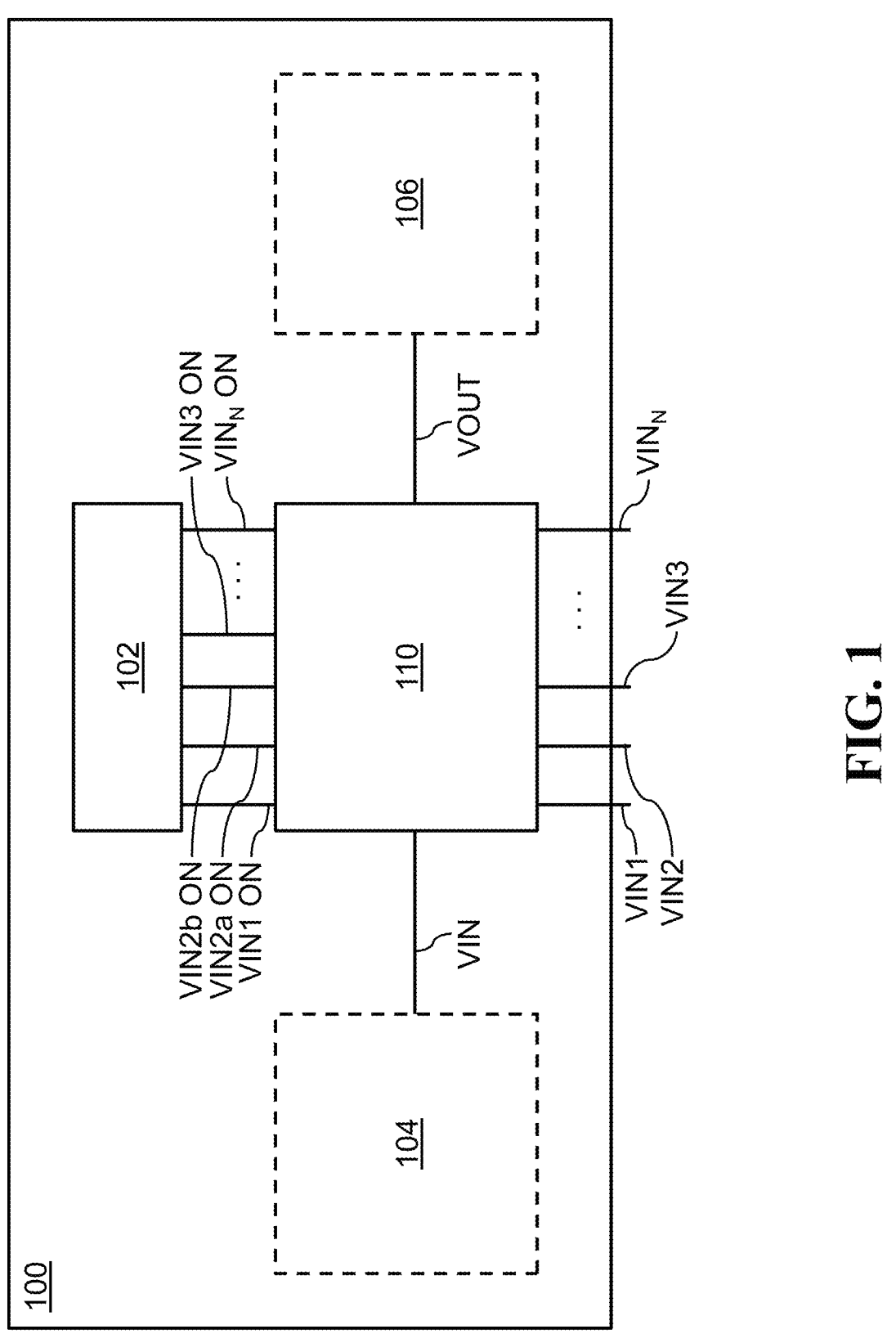
FIG. 1 is a block diagram of an example system for power multiplexing according to an embodiment.
Figure 2:
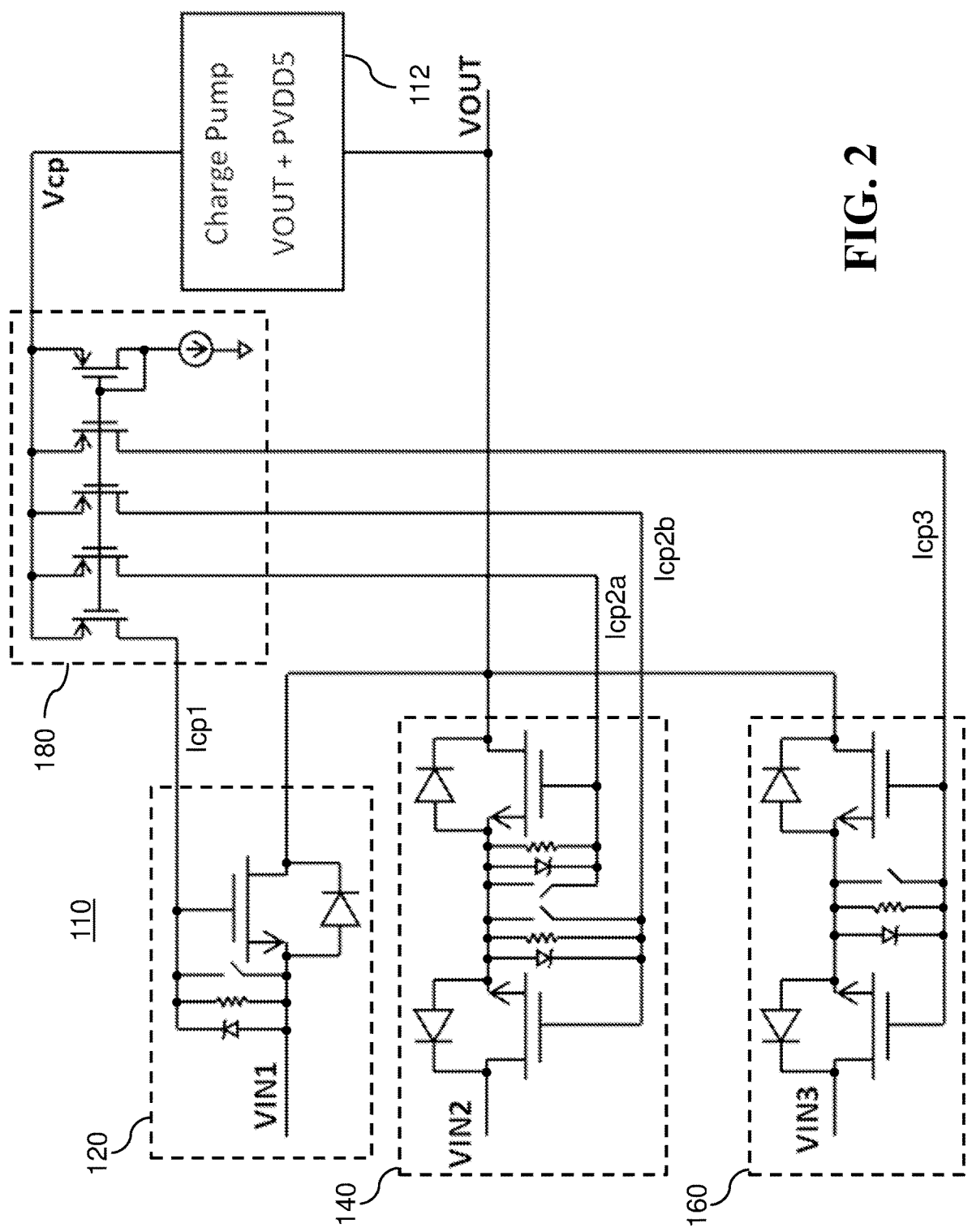
FIG. 2 is a circuit diagram of an example semiconductor device for power multiplexing according to an embodiment.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As power supply technologies improve, many systems include the option to use more than one power input channel for charging a battery or powering the system. As an example, a particular system may be able to function or charge its battery under power from a wireless power source, under power from a standard outlet adapter and plug, under power from a USB connection (e.g., power from a computer, car, etc.) or under power from another power input technology. Power multiplexers (MUXs) are used to select one of the power input channels and route its output to supply other ICs of such a system such as, e.g., battery charger circuitry or any other circuitry. The power MUX may be part of a stand-alone integrated circuit (IC) or in some embodiments, may be integrated with other circuitry of the system including, e.g., wireless power transfer circuitry, battery charging circuitry or any other circuitry. For example, where wireless power transfer circuitry is integrated with battery charger circuitry, power MUX circuitry may also be integrated on the same integrated circuit (IC) as an intermediary to select the power input channel, e.g., in a case where other power input channels from other power sources such as a standard outlet adapter and plug and USB are also available to power the system ICs.

Power MUX circuitry often includes a power driver for each power input channel. Such power MUX circuitry may also need to power the gate of its power driver, e.g., from the power input channel. For example, the power MUX circuitry may utilize a separate charge pump for each power input channel to create an additional rail for powering the gate of the corresponding power driver, e.g., via an operational amplifier. One or more control signals may then be utilized by the power MUX to turn on or off each power driver, e.g., by activating the operational amplifier to power the gate of the corresponding power driver from the additional rail. In addition, since the power drivers are in the high voltage domain, they may also require additional level shifters for reducing the voltage of any control signal to the gate control circuitry of the operational amplifier to the low voltage domain. The charge pump, operational amplifier, and level shifters for each power input channel may require a significant area of the real-estate of an IC. Where multiple power input channels are utilized, the cumulative area cost can be significant, with each additional power input channel requiring a substantial additional area of the real-estate of an IC to accommodate the additional power driver, charge pump, operational amplifier and level shifter.

With reference to FIG. 1, an example system 100 comprising a power MUX 110 according to an embodiment will be described. In an example embodiment, power MUX 110 may be under control of a controller 102 and may act as an intermediary between power input channels and other circuitry of system 100. As an example, in an embodiment, power MUX 110 may be disposed between a variety of power input channels and battery charging circuitry 106. One example power input channel may comprise wireless power transfer circuitry 104. In some embodiments one or more of these components may be integrated into a single integrated circuit (ICs).

Power MUX 110 can be configured to receive power from one or more power input channels including, e.g., VIN from wireless power transfer circuitry 104, VIN1, VIN2a, VIN2b, VIN3, . . . . $VIN_N$ where power MUX 110 may be configured for any number of power input channels. While VIN1, VIN2a, VIN2b and VIN3 are shown as receiving power from external sources to system 100, any of VIN1, VIN2a, VIN2b and VIN3 may also or alternatively receive power from wireless power transfer circuitry 104, e.g., replacing VIN, or from other circuitry of system 100. Example power input circuits 120, 140 and 160 of power MUX 110 for handling power input channels VIN1, VIN2a, VIN2b and VIN3 are described in more detail below but may readily be applied to any other power input channel including VIN, $VIN_N$ or any other power input channel.

Controller 102 is configured to control and operate power MUX 110 and in some embodiments may control and operate other components of system 100. Controller 102 comprises, for example, a processor, central processing unit (CPU), field-programmable gate array (FPGA) or any other circuitry that is configured to control and operate power MUX 110. While described as a CPU in illustrative embodiments, controller 102 is not limited to a CPU in these embodiments and may comprise any other circuitry that is configured to control and operate power MUX 110. In an example embodiment, controller 102 is configured to control power MUX 110 to switch between power input channels using one or more signals. In one example, controller 102 may provide signals VIN1 ON, VIN2a ON, VIN2b ON, VIN3 ON . . . $VIN_N$ ON to power MUX 110. Controller 102 may be configured as a separate component from power MUX 110 or may be included as a part of power MUX 110. Controller 102 and power MUX 110 may be integrated into the same IC in some embodiments.

With reference to FIGS. 2-6, power MUX 110 can be implemented by one or more semiconductor devices. Power MUX 110 can include a power input circuit 120, a power input circuit 140, a power input circuit 160, a switching circuit 180 and a charge pump 112. Power input circuit 120 can receive power from power input channel VIN1, power input circuit 140 receives power from power input channel VIN2 and power input circuit 160 receives power from power input channel VIN3. Each of power input circuits 120, 140 and 160 outputs power to VOUT. While power MUX 110 may have more power input channels, e.g., as shown in FIG. 1, the function of power MUX 110 will be described below with reference to power input channels VIN1, VIN2 and VIN3 for clarity and brevity. Any of the functionalities described below for power input circuits 120, 140 and 160 and power input channels VIN1, VIN2 and VIN3 may be applied to any other power input channels of power MUX 110.

Charge pump 112 can receive VOUT as an input and generates a charge pump voltage Vcp as an output. Vcp is disposed on top of VOUT and comprises VOUT+PVDDS. PVDDS can be a reference voltage, e.g., 5V or another voltage, such that Vcp is always at least PVDDS (when VOUT is 0) or PVDDS+VOUT (when VOUT is another value). As an example, if VOUT is 10V and PVDDS is 5V, Vcp is output at 15V. Similarly, if VOUT is 0V and PVDDS is 5V, Vcp is output at 5V. Other voltage values for PVDDS and VOUT may alternatively be utilized. Note that as a power driver from one of power input circuits 120, 140 and 160 ramps up its output to VOUT, the value of Vcp will also increase accordingly.

With reference to FIGS. 2-5, each of power input circuits 120, 140 and 160 may connect to different power input channel including, e.g., wall outlets, batteries, wireless charging circuitry, USB connections or any other power input source, and provides a different type of control over the input signal. Power input circuit 120 comprises a single pass device and each of power input circuits 140 and 160 comprises a different type of back-to-back pass device. While three types of power input circuits are illustrated in FIGS. 2-5, any other type or configuration of power input circuit may also or alternatively be utilized. In other embodiments, power MUX 110 may comprise any other number or type of power input circuits. In some embodiments, duplicates of power input circuits 120, 140 or 160 may also or alternatively be utilized for different or additional power input channels.

Figure 3:
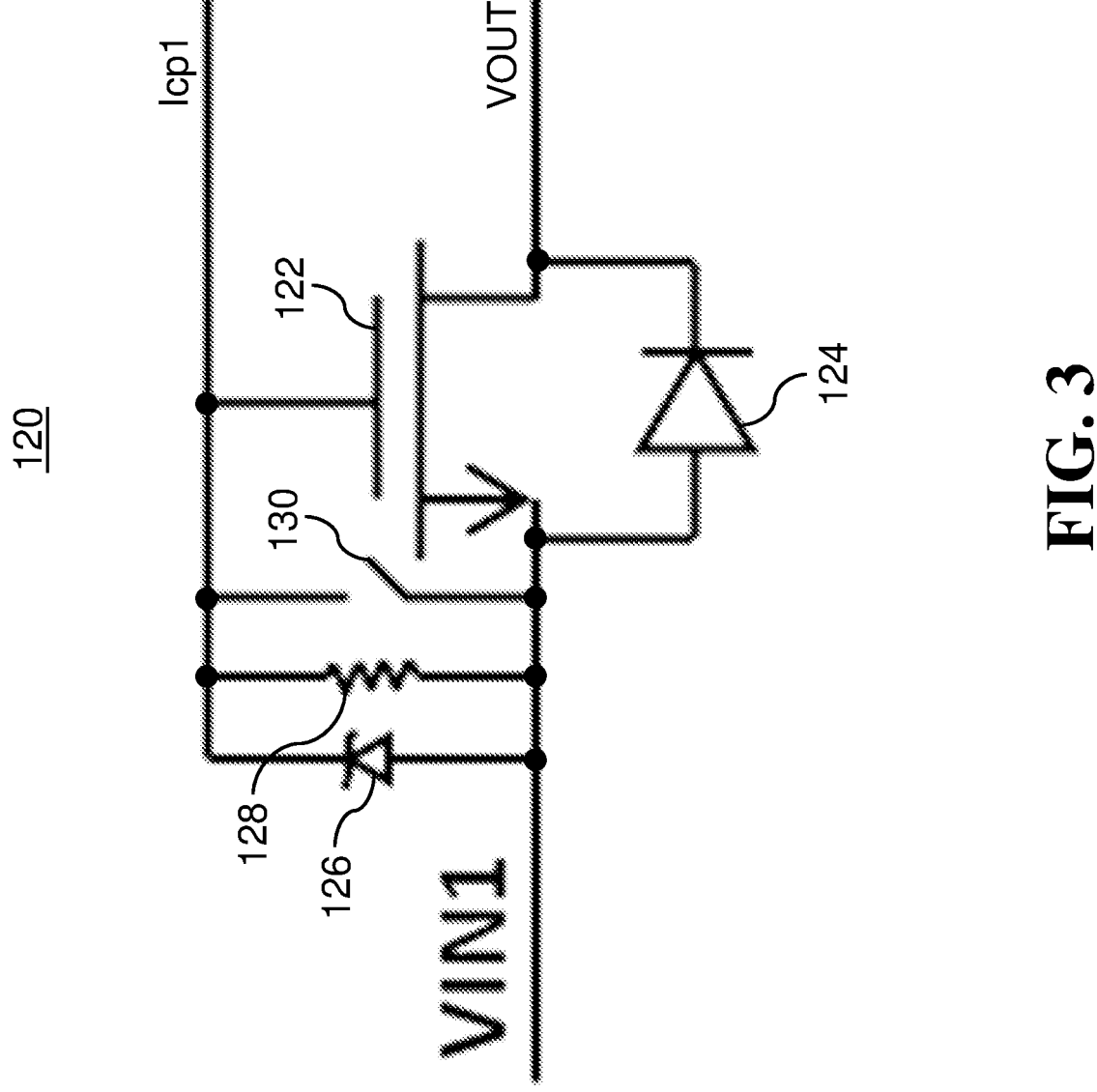
FIG. 3 is a circuit diagram of an input circuit for a single pass device of the semiconductor device of FIG. 1 according to an embodiment.

With reference to FIG. 3, power input circuit 120 comprises power driver 122, a diode 124, a diode 126, a resistor 128, and a switch 130. Power input circuit 120 takes VIN1 and a charge pump current Icp1 as inputs and outputs to VOUT. Charge pump current Icp1 can be received from switching circuit 180 and corresponds to Vcp as modified by the current mirror circuitry of switching circuit 180. Diode 124 bypasses power driver 122 and provides power from VIN1 to VOUT even when power driver 122 is turned off. In some embodiments, diode 124 may be configured to provide a reduced or limited amount of power to VOUT from VIN1. As an example, if VIN1 is 10V, diode 124 may have a diode drop of 1V, leaving 9V to pass through to VOUT.

Diode 126, resistor 128 and switch 130 are disposed in parallel between VIN1 and Icp1. Diode 126 and resistor 128 are passive devices that are configured to maintain control of the gate. For example, diode 126 may comprise a passive protection device, such as a Zener diode, that is configured to pull down the gate of power driver 122 to VIN1 in the event that there is a high current at the gate above a predetermined threshold value as a protection mechanism. Resistor 128 may be utilized to slowly pull down the gate of power driver 122 to VIN1 in a case where Icp1 is switched off. Switch 130 can be an active device or active element that may be closed to act as a pull down for quickly turning off power driver 122 and equalizing the gate of power driver 122 to VIN1. In some embodiments, the pull down from diode 126, resistor 128 or switch 130 may be relatively weak toward ground to remove or reduce the need for using a level shifter. Switch 130 may be controlled by control signal VIN1 ON, e.g., received from controller 102 of the system 100. As an example, in some embodiments a first value of control signal VIN1 ON, e.g., low or 0, may close switch 130, while a second value of control signal VIN1 ON, e.g., high or 1, may open switch 130. In some embodiments, the control signal VIN1 ON may also control the corresponding switch 184 in switching circuitry 180 via current generator 182. For example, the second value of control signal VIN1 ON, e.g., high or 1, may cause current generator 182 to open switch 184 to output Icp1 to power input circuit 120 while the first value of control signal VIN1 ON, e.g., low or 0, may cause current generator 182 to close switch 184 and shut off the output of Icp1 to power input circuit 120. Other values of VIN1 ON may alternatively be utilized for controlling switch 130 and switch 184. In other embodiments, switch 130 and switch 184 may be controlled by separate control signals.

Figure 4:
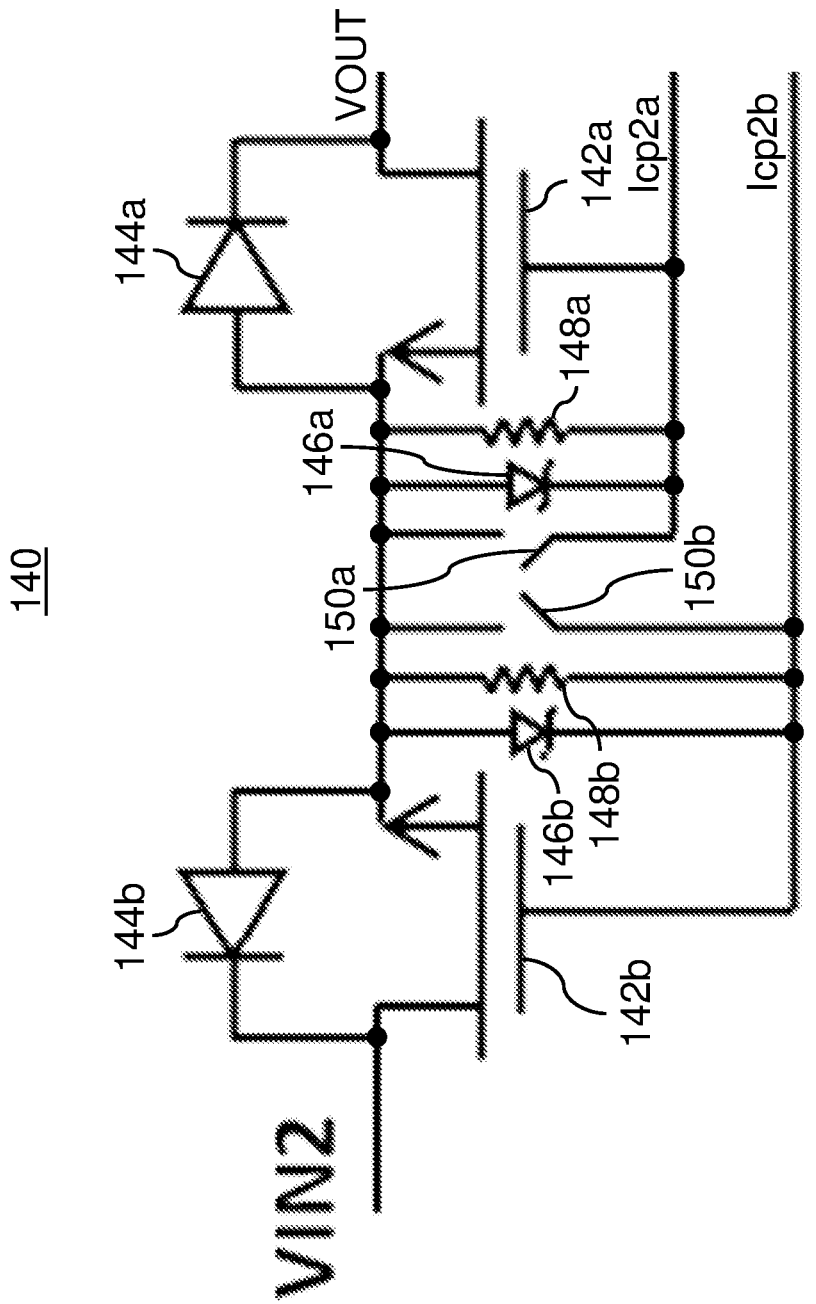
FIG. 4 is a circuit diagram of an input circuit for a back-to-back connected pass device of the semiconductor device of FIG. 1 with each pass device controlled by a separate signal according to an embodiment.

With reference to FIG. 4, power input circuit 140 comprises power driver 142a, a power driver 142b, a diode 144a, a diode 144b, a diode 146a, a diode 146b, a resistor 148a, a resistor 148b, a switch 150a and a switch 150b. Power input circuit 140 takes VIN2, charge pump currents Icp2a and Icp2b as inputs and outputs to VOUT. Charge pump currents Icp2a and Icp2b can be received from switching circuit 180 and correspond to Vcp as modified by the current mirror circuitry of switching circuit 180. Power drivers 142a and 142b are disposed in a back-to-back configuration with diodes 144a and 144b inhibiting the flow of power from VIN2 to VOUT when power drivers 142a and 142b are turned off. In another example embodiment, power drivers 142a and 142b can be driven separately by different gate drive controls. By way of example, in a low power mode, power driver 142a can be kept off and power driver 142b can be the only driver being controlled and kept on so that the power can be transferred with diode 144a. In another embodiment, power driver 142a can be kept on and power driver 142b can be controlled in order to allow any jumps on VOUT to be transferred to VIN2. In another embodiment, power driver 142b can be kept on and power driver 142a can be controlled such that power input circuit 140 can function similarly to power input circuit 120 of FIG. 3. The independent control of power drivers 142a, 142b can provide a flexibility to react faster in protection modes, such as allow all switches to be turned off to block current immediately and resume after a short break.

Diode 146a, resistor 128a and switch 150a are disposed in parallel between VIN2 and Icp2a. Diode 146b, resistor 128b and switch 150b are disposed in parallel between VIN2 and Icp2b. Diodes 146a and 146b and resistors 148a and 148b are passive devices that are configured to maintain control of the gates of power drivers 142a and 142b. For example, diodes 146a and 146b may comprise passive protection devices, such as a Zener diodes, that are configured to pull down the gates of power drivers 142a and 142b to VIN2 in the event that there is a high current at the corresponding gate above a predetermined threshold value as a protection mechanism. Resistors 148a and 148b may be utilized to slowly pull down the gates of power drivers 142a and 142b to VIN2 in a case where Icp2a or Icp2b is switched off, respectively. Switches 150a and 150b can be active devices or active elements that may be closed to act as a pull down for quickly turning off power drivers 142a and 142b, respectively, and equalizing corresponding gates to VIN2. In some embodiments, the pull down from diodes 146a and 146b, resistors 148a and 148b or switches 150a and 150b may be relatively weak toward ground to remove or reduce the need for using a level shifter.

Switches 150a and 150b may be controlled by corresponding control signals VIN2a ON and VIN2b ON, e.g., received from controller 102 of the system 100. As an example, in some embodiments a first value of control signal VIN2a ON, e.g., low or 0, may close switch 150a, while a second value of control signal VIN2a ON, e.g., high or 1, may open switch 150a. Similarly, in some embodiments a first value of control signal VIN2b ON, e.g., low or 0, may close switch 150b, while a second value of control signal VIN2b ON, e.g., high or 1, may open switch 150b.

Figure 6:
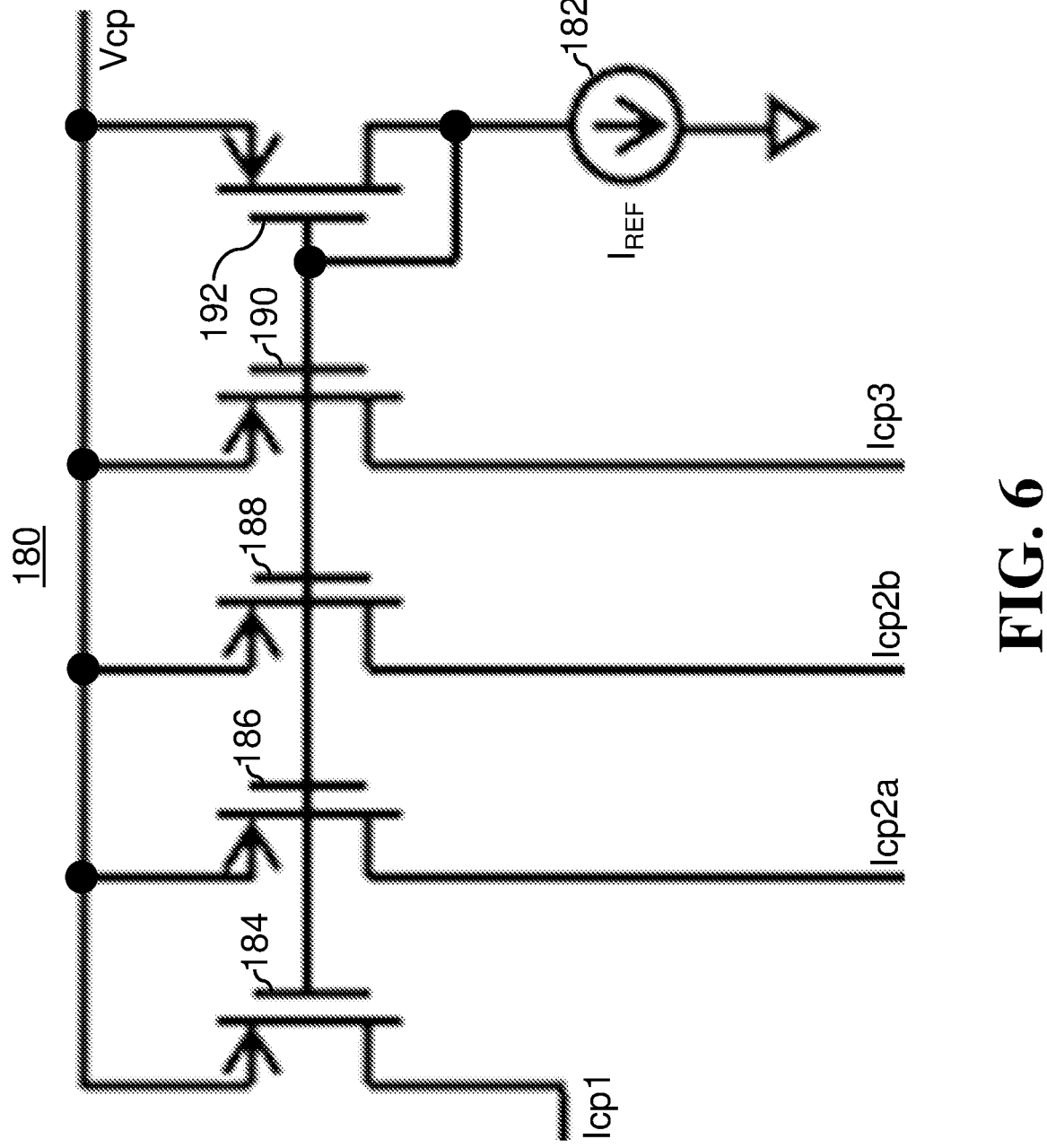
FIG. 6 is a circuit diagram of a switching circuit of the semiconductor device of FIG. 1 according to an embodiment.

In some embodiments, the control signals VIN2a ON and VIN2b ON may also control the corresponding switches 186 and 188 in switching circuitry 180 via current generator 182 (see FIG. 6). For example, the second values of control signals VIN2a ON and VIN2b ON, e.g., high or 1, may cause current generator 182 to open the corresponding switches 186 and 188 to output Icp2a and Icp2b to power input circuit 140 while the first values of control signals VIN2a ON and VIN2b ON, e.g., low or 0, may cause current generator 182 to close the corresponding switches 186 and 188 and shut off the output of Icp2a and Icp2b to power input circuit 140. Other values of VIN2a ON and VIN2b ON may alternatively be utilized for controlling switches 150a and 150b and switches 186 and 188. In other embodiments, switches 150*a* and 150*b* and switches 186 and 188 may be controlled by separate control signals.

Figure 5:
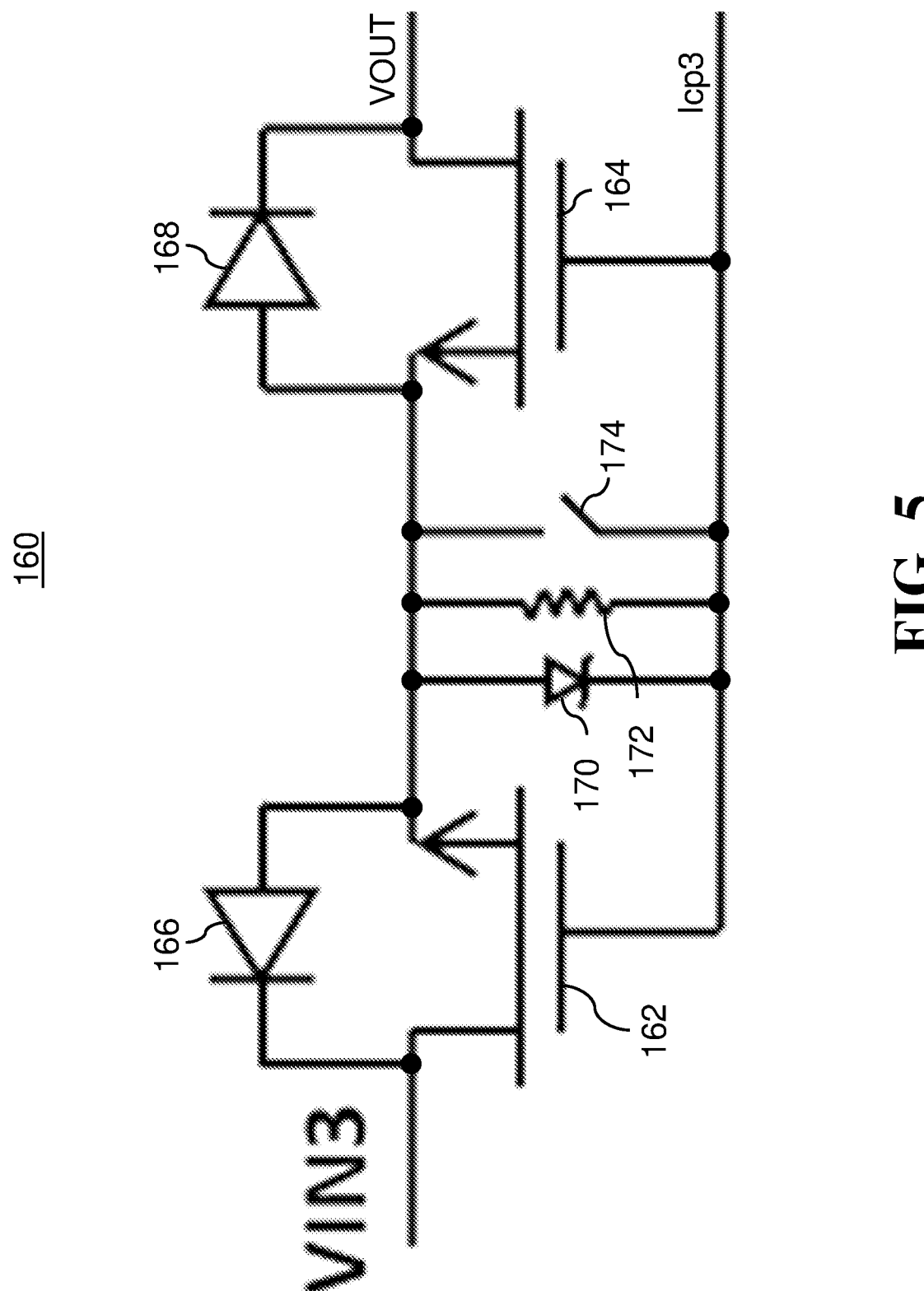
FIG. 5 is a circuit diagram of an input circuit for a back-to-back connected pass device of the semiconductor device of FIG. 1 with both pass devices being controlled by the same signal according to an embodiment.

With reference to FIG. 5, power input circuit 160 comprises power drivers 162 and 164, diodes 166 and 168, a diode 170, a resistor 172 and a switch 174. Power input circuit 160 takes VIN3 and charge pump current Icp3 as inputs and outputs to VOUT. Icp3 is received from switching circuit 180 and corresponds to Vcp as modified by the current mirror circuitry of switching circuit 180. Power drivers 162 and 164 are disposed in a back-to-back configuration with diodes 166 and 168 inhibiting the flow of power from VIN3 to VOUT when power drivers 162 and 164 are turned off.

Diode 170, resistor 172 and switch 174 are disposed in parallel between VIN3 and Icp3. Diode 170 and resistor 172 are passive devices that are configured to maintain control of the gate. For example, diode 170 may comprise a passive protection device, such as a Zener diode, that is configured to pull down the gates of power drivers 162 and 164 to VIN3 in the event that there is a high current at either gate above a predetermined threshold value as a protection mechanism. Resistor 172 may be utilized to slowly pull down the gates of power drivers 162 and 164 to VIN3 in a case where Icp3 is switched off. Switch 174 can be an active device or an active element that may be closed to act as a pull down for quickly turning off power drivers 162 and 164 and equalizing the gates of power drivers 162 and 164 to VIN3. In some embodiments, the pull down from diode 170, resistor 172 or switch 174 may be relatively weak toward ground to remove or reduce the need for using a level shifter.

Switch 174 may be controlled by a control signal VIN3 ON, e.g., received from controller 102 of the system 100. As an example, in some embodiments a first value of control signal VIN3 ON, e.g., low or 0, may close switch 174, while a second value of control signal VIN3 ON, e.g., high or 1, may open switch 174. In some embodiments, the control signal VIN3 ON may also control the corresponding switch 190 in switching circuitry 180 via current generator 182. For example, the second value of control signal VIN1 ON, e.g., high or 1, may cause current generator 182 to open switch 190 to output Icp3 to power input circuit 160 while the first value of control signal VIN3 ON, e.g., low or 0, may cause current generator 182 to close switch 190 and shut off the output of Icp3 to power input circuit 160. Other values of VIN3 ON may alternatively be utilized for controlling switch 174 and switch 190. In other embodiments, switch 174 and switch 190 may be controlled by separate control signals.

With reference to FIG. 6, switching circuit 180 comprises current generator 182, and current mirror switches 184, 186, 188, 190 and 192. Current generator 182 is configured to maintain a current on the gates of switches 184, 186, 188, 190 and 192 at a reference current $I_{REF}$ which is then mirrored to outputs Icp1, Icp2*a*, Icp2*b*, and Icp3. Switches 184, 186, 188, 190 and 192 may comprise transistors such as, e.g., field-effect transistors (FETS), metal-oxide-semiconductor field-effect transistors (MOSFETs), bipolar junction transistors (BJTs) or any other transistor, switching or current mirror technologies.

Switches 184, 186, 188, 190 and 192 each receive Vcp as their source. The drain of switch 184 outputs Icp1, the drain of switch 186 outputs Icp2*a*, the drain of switch 188 outputs Icp2*b*, the drain of switch 190 outputs Icp3 and the drain of switch 192 outputs to the gates of switches 184, 186, 188, 190 and 192 under current control by current generator 182.

Vcp is utilized to supply a high voltage current mirror for switching circuit 180. For example, Vcp provides a voltage input to switching circuit 180 which outputs a corresponding Icp1, Icp2*a*, Icp2*b*, and Icp3 to each of power input circuits 120, 140 and 160 that has a current mirrored to a corresponding current $I_{REF}$ maintained by current generator 182. In some embodiments, the currents of outputs Icp1, Icp2*a*, Icp2*b*, and Icp3 may be equivalent to $I_{REF}$. In other embodiments, the current for one or more of Icp1, Icp2*a*, Icp2*a*, and Icp3 may alternatively be a fraction or multiple of $I_{REF}$, e.g., based on the relationship between the width (W) and length (L) of each switch 184, 186, 188 and 190 and the W and L of the reference switch 192.

The configuration of switching circuit 180 facilitates current mirroring of the current $I_{REF}$ output by current generator 182 to Icp1, Icp2*a*, Icp2*b*, and Icp3 using switches 184, 186, 188, 190 and 192. Icp1, Icp2*a*, Icp2*b* and Icp3 are then utilized as current sources for driving the power drivers 122, 142*a*, 142*b*, 162 and 164 of the corresponding power input circuits 120, 140 and 160. Based on the control signals VIN1 ON, VIN2*a* ON, VIN2*b* ON and VIN3 ON received from controller 102, the corresponding current sources Icp1, Icp2*a*, Icp2*b* and Icp3 are enabled by activating the corresponding switches 184, 186, 188 and 190. The gates of power drivers 122, 142*a*, 142*b*, 162 and 164 are charged up with the current sources. In some embodiments, current generator 182 may be configured to adjust $I_{REF}$ as needed to increase or decrease the current output of switches 184, 186, 188, 190 and 192 such that the corresponding current source Icp1, Icp2*a*, Icp2*b* and Icp3 adjusts the slew strengths of the gates of power drivers 122, 142*a*, 142*b*, 162 and 164.

In an embodiment, the enabling of current sources Icp1, Icp2*a*, Icp2*b* and Icp3 may be performed by switching circuit 180 in the low voltage domain without the need to utilize a level shifter. For example, $I_{REF}$ may generate a current in the milliamp range and switches 184, 186, 188 and 190 may have a substantially smaller area on the IC than power drivers 122, 142*a*, 142*b*, 162 and 164. For example, in some embodiments the area used for each switch 184, 186, 188 and 190 may be 10× smaller than that used by the corresponding power driver 122, 142*a*, 142*b*, 162 and 164.

By utilizing a charge pump on VOUT instead of a separate charge pump off of the VIN for each power input channel, a single charge pump may be utilized to control the switching of power drivers on any number of power input channels with minimal circuitry additions. This provides a significant area advantage on the IC over configurations utilizing a separate charge pump for each VIN. In addition, the switching circuitry for controlling the power drivers for each power input channel are configured and controller in the low voltage domain, thereby controlling the switching of the power drivers for each power input channel without the need to employ low to high voltage level shifters. The low voltage domain switches of the switching circuit also have a much smaller area of the footprint as compared to operational amplifiers and other switching circuitry that would otherwise be employed at each power input channel in the high voltage domain. The same switching circuit is configured to control a variety of types of power drivers for different power input channels including single pass devices, back-to-back connected pass devices controlled by a single control signal, and back-to-back connected pass devices where each power driver is controlled by a separate control signal.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A power multiplexer device comprising:
a first power input circuit, the first power input circuit comprising a first power driver comprising a first gate, the first power input circuit being configured to receive power from a first power input channel and to output power to a power output channel via the first power driver;
a second power input circuit, the second power input circuit comprising a second power driver comprising a second gate, the second power input circuit being configured to receive power from a second power input channel and to output power to the power output channel via the second power driver;
a charge pump connected to the power output channel, the charge pump being configured to generate an output having a voltage greater than a voltage on the power output channel; and
a switching circuit connected to the output of the charge pump, the switching circuit being configured to selectively control the first and second gates to drive the first and second power input circuits to output power to the power output channel,
wherein:
the switching circuit comprises a current generator, a first transistor switch corresponding to the first power input circuit and a second transistor switch corresponding to the second power input circuit;
each of the first and second transistor switches is configured as a current mirror driven by a reference current output of the current generator; and
the switching circuit is further configured to:
selectively supply a first current output of the first transistor switch to the first gate of the first power driver to selectively control the first gate; and
selectively supply a second current output of the second transistor switch to the second gate of the second power driver to selectively control the second gate.

2. The power multiplexer device of claim 1, wherein the switching circuit is configured to selectively supply the first and second current outputs of the first and second transistor switches to the first and second gates based on at least one control signal received from a controller.

3. The power multiplexer device of claim 2, wherein the first and second power input circuits are in a high voltage domain and the at least one control signal controls the switching circuit in a low voltage domain.

4. The power multiplexer device of claim 1, wherein:
the current generator comprises an adjustable current generator that is configured to adjust the reference current output;
the first current output of the first transistor switch is configured to change based on changes in the reference current output, changes to the first current output being configured to drive a change in a slew strength of the first gate; and
the second current output of the second transistor switch is configured to change based on changes in the reference current output, changes to the second current output being configured to drive a change in a slew strength of the second gate.

5. The power multiplexer device of claim 1, wherein the first power input circuit comprises a passive protection device, the passive protection device being configured to pull down the first gate to the first power input channel.

6. The power multiplexer device of claim 5, wherein the passive protection device comprises a resistor that is configured to slowly pull down the first gate to the first power input channel when the first gate is unpowered by the switching circuit.

7. The power multiplexer device of claim 5, wherein the passive protection device comprises a Zener diode that is configured to pull down the first gate to the first power input channel when a current of the first gate is above a predetermined threshold.

8. The power multiplexer device of claim 5, wherein the first power input circuit comprises an active device that is configured to rapidly pull down the first gate to the first power input channel based on a signal received from a controller.

9. The power multiplexer device of claim 1, wherein:
the second power input circuit further comprises a third power driver comprising a third gate;
the second power input circuit is configured to receive power from the second power input channel and to output power to the power output channel via the second and third power drivers; and
the switching circuit is configured to selectively supply a current output of a transistor switch to both the second gate of the second power driver and the third gate of the third power driver to selectively control the second and third gates.

10. The power multiplexer device of claim 1, wherein:
the second power input circuit further comprises a third power driver comprising a third gate;
the second power input circuit is configured to receive power from the second power input channel and to output power to the power output channel via the second and third power drivers;
the switching circuit comprises a transistor switch corresponding to the second power input circuit;
the transistor switch is configured as a current mirror driven by a reference current output of a current generator in the switching circuit; and
the switching circuit is configured to selectively supply a current output of the transistor switch to the third gate of the third power driver to selectively control the third gate separately from the second gate.

11. A semiconductor device comprising:

a first power input circuit, the first power input circuit comprising a first power driver comprising a first gate, the first power input circuit being configured to receive power from a first power input channel and to output power to a power output channel via the first power driver;

a second power input circuit, the second power input circuit comprising a second power driver comprising a second gate, the second power input circuit being configured to receive power from a second power input channel and to output power to the power output channel via the second power driver; and a switching circuit comprising a current generator, a first transistor switch corresponding to the first power input circuit and a second transistor switch corresponding to the second power input circuit, each of the first and second transistor switches being configured as a current mirror driven by a reference current output of the current generator, the switching circuit being configured to:

selectively supply a first current output of the first transistor switch to the first gate of the first power driver to selectively control the first gate; and selectively supply a second current output of the second transistor switch to the second gate of the second power driver to selectively control the second gate.

12. The semiconductor device of claim 11, wherein the switching circuit is configured to selectively supply the first and second current outputs of the first and second transistor switches to the first and second gates based on at least one control signal received from a controller.

13. The semiconductor device of claim 12, wherein the first and second power input circuits are in a high voltage domain and the at least one control signal controls the switching circuit in a low voltage domain.

14. The semiconductor device of claim 11, wherein:

the current generator comprises an adjustable current generator that is configured to adjust the reference current output;

the first current output of the first transistor switch is configured to change based on changes in the reference current output, changes to the first current output being configured to drive a change in a slew strength of the first gate; and the second current output of the second transistor switch is configured to change based on changes in the reference current output, changes to the second current output being configured to drive a change in a slew strength of the second gate.

15. The semiconductor device of claim 11, wherein the first power input circuit comprises a passive protection device, the passive protection device being configured to pull down the first gate to the first power input channel, the passive protection device comprising at least one of a resistor and a Zener diode.

16. The semiconductor device of claim 11, wherein the semiconductor device further comprises a charge pump connected to the power output channel, the charge pump being configured to generate an output having a voltage greater than a voltage on the power output channel, the switching circuit being connected to the output of the charge pump.

17. A semiconductor device comprising:

a wireless power transfer circuit that is configured to output a first power input channel;

a power multiplexer circuit comprising:

a first power input circuit, the first power input circuit comprising a first power driver comprising a first gate, the first power input circuit being configured to receive power from the first power input channel and to output power to a power output channel via the first power driver;

a second power input circuit, the second power input circuit comprising a second power driver comprising a second gate, the second power input circuit being configured to receive power from a second power input channel and to output power to the power output channel via the second power driver;

a charge pump connected to the power output channel, the charge pump being configured to generate an output having a voltage greater than a voltage on the power output channel; and a switching circuit connected to the output of the charge pump, the switching circuit being configured to selectively control the first and second gates to drive the first and second power input circuits to output power to the power output channel; and a battery charger circuit that is configured to receive the power output channel, the battery charger circuit being configured to charge a battery based on the power output channel, wherein:

the switching circuit comprises a current generator, a first transistor switch corresponding to the first power input circuit and a second transistor switch corresponding to the second power input circuit;

each of the first and second transistor switches is configured as a current mirror driven by a reference current output of the current generator; and the switching circuit is configured to:

selectively supply a first current output of the first transistor switch to the first gate of the first power driver to selectively control the first gate; and selectively supply a second current output of the second transistor switch to the second gate of the second power driver to selectively control the second gate.

18. The semiconductor device of claim 17, wherein:

the switching circuit is configured to selectively supply the first and second current outputs of the first and second transistor switches to the first and second gates based on at least one control signal received from a controller;

the first and second power input circuits are in a high voltage domain; and the at least one control signal controls the switching circuit in a low voltage domain.

* * * * *